United States Patent
Yamada

[11] Patent Number: 6,160,288
[45] Date of Patent: Dec. 12, 2000

[54] VERTICAL TYPE MISFET HAVING IMPROVED PRESSURE RESISTANCE

[75] Inventor: Manabu Yamada, Tokyo, Japan

[73] Assignee: NEC Corporation, Tokyo, Japan

[21] Appl. No.: 09/252,662

[22] Filed: Feb. 19, 1999

[30] Foreign Application Priority Data

Feb. 20, 1998 [JP] Japan .................................. 10-038287

[51] Int. Cl.⁷ .............................................. H01L 29/772
[52] U.S. Cl. .......................................... 257/330; 257/339
[58] Field of Search .................... 257/327, 333, 257/339

[56] References Cited

U.S. PATENT DOCUMENTS

| | | | |
|---|---|---|---|
| 5,714,781 | 2/1998 | Yamamoto et al. | 257/330 |
| 5,821,583 | 10/1998 | Hshieh et al. | 257/330 |

FOREIGN PATENT DOCUMENTS

| | | |
|---|---|---|
| 286171 | 3/1990 | Japan . |
| 3-55879 | 3/1991 | Japan . |
| 621468 | 1/1994 | Japan . |
| 8250732 | 9/1996 | Japan . |
| 2622378 | 4/1997 | Japan . |
| 9-254671 | 9/1997 | Japan . |

Primary Examiner—David Hardy
Attorney, Agent, or Firm—Young & Thompson

[57] ABSTRACT

A vertical type MISFET having a trench structure is improved in pressure resistance without increasing its on-resistance. In the vertical type MISFET, a p-type base region is so formed as to be deeper than a trench immediately under which is formed an n-type semiconductor region. This region is adjacent to an n-type epitaxial layer and higher in concentration of impurities than an n-type semiconductor substrate.

17 Claims, 10 Drawing Sheets

73; p-type base region
72; n⁻-type epitaxial layer
71; n⁺-type semiconductor substrate

VERTICAL TYPE MISFET HAVING IMPROVED PRESSURE RESISTANCE

BACKGROUND OF THE INVENTION

1. Field of the Invention

The present invention relates to a vertical type MISFET (Metal Insulator Semiconductor Field Effect Transistor) and a method of its production, and more particularly to a vertical type MISFET and a method of its production, wherein the MISFET has a trench structure.

2. Description of the Related Art

Heretofore, a MOSFET (Metal Oxide Semiconductor Field Effect Transistor) has been used as a kind of power devices for handling relatively large currents and large voltages. Since the MOSFET is a voltage-controlled device, the MOSFET is advantageous in that it does not require any input current. Further, in principle, since only ones of holes and electrons in great numbers are used as carriers in the MOSFET in operation, there is no effect of carrier accumulation, so that the MOSFET is excellent in switching characteristics and in anti-punch-through characteristics. Due to these characteristics, the MOSFET has been widely applied to inductive loads such as switching regulators and the like.

As for such MOSFET, there is an initial type of lateral type MOSFET, in which an operating current (drain current) flows in a direction (or, lateral direction) parallel to a main plane of a semiconductor substrate. In contrast with this initial type, recently, the vertical type MOSFET has been widely used, in which the drain current flows in a direction (or, vertical direction) perpendicular to the main plane of the semiconductor substrate. In this vertical type MOSFET, it is possible to connect a large number of cells (i.e., unit devices) in parallel with each other so as to form a MOSFET. Consequently, such vertical type MOSFET is advantageous in that it is capable of increasing its current capacity.

Here, as the most important characteristics of conventional MOSFET including the vertical type MOSFET, there are on-resistance characteristics. Since the on-resistance characteristics largely affect a switching operation of the MOSFET, it is desirable to reduce the on resistance. Consequently, even in the vertical type MOSFET, in order to enjoy the above-mentioned advantages, it is necessary to reduce the on resistance.

Figure 16:
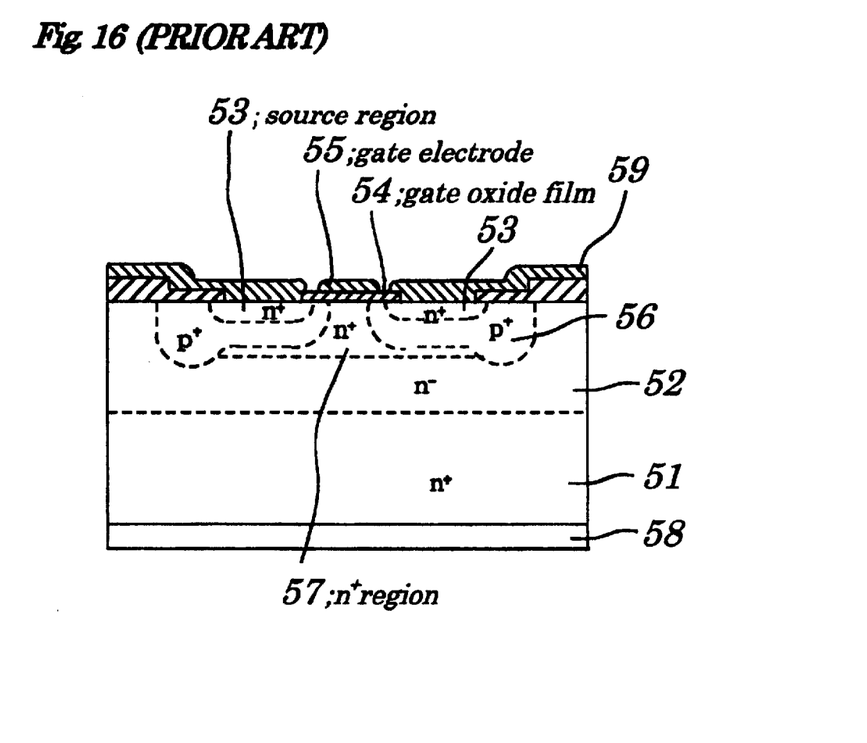
FIG. 16 is a cross-sectional view of a conventional vertical type MISFET.

As a vertical type MOSFET reducing its on resistance, Japanese Patent Laid-Open No. Sho 63-23365 discloses a MOSFET shown in FIG. 16, in which: a pair of divided $n^+$-type source regions 53 are formed in a surface of an $n^-$-type epitaxial layer 52 which is formed on an $n^+$-type substrate 51; a gate electrode 55 is formed on a gate oxide film 54 between these source regions 53. Further, formed immediately under the $n^+$-type source regions 53 are a pair of $p^+$-type base regions 56. Of these regions 56, ones immediately under the gate oxide film 54 form inverted regions when a gate voltage is controlled. The thus inverted regions function as channel regions. Further, formed in a region immediately under the gate electrode 55 forming a part of a path for a drain current is an $n^+$-type region 57 which functions to reduce the on resistance of the vertical MOSFET in operation. Incidentally, as shown in FIG. 16, a drain electrode 58 is oppositely disposed from a source electrode 59 in a vertical direction.

On the other hand, in the prior art disclosed in the above Japanese Patent Laid-Open No. Sho 63-23365, though it is possible to reduce the on resistance of a vertical MOSFET, there is imitation in downsizing its cells since the channel region is formed in a horizontal direction in which the gate electrode 55 is arranged. Due to this, when a large number of cells are connected in parallel with each other in the MOSFET in order to increase its current capacity, it is inevitable that a semiconductor chip thus formed increases in size.

Figure 17:
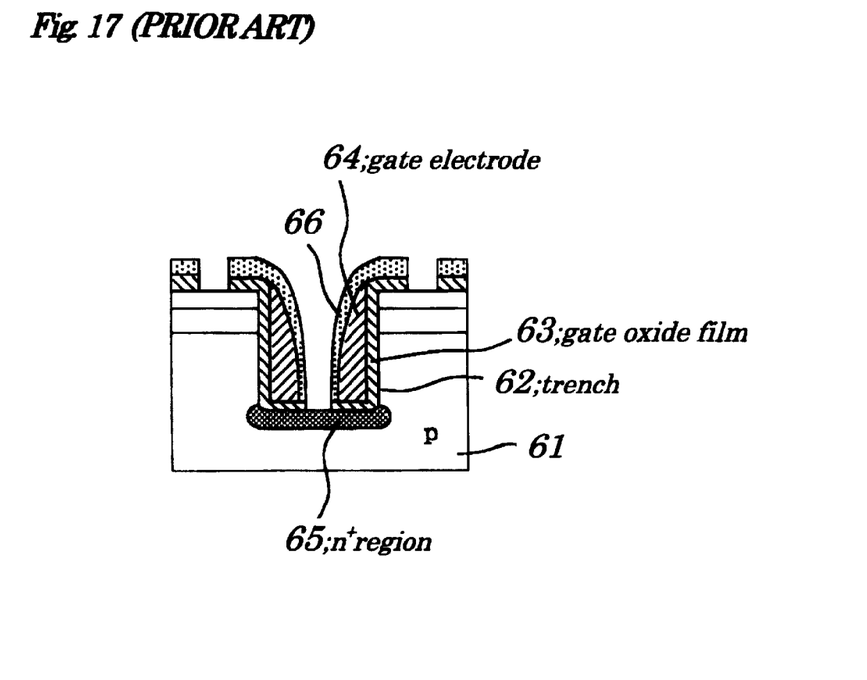
FIG. 17 is a cross-sectional view of a conventional vertical type MISFET.

In this respect, Japanese Patent Laid-Open No. Hei 3-55879 discloses a MOSFET in which, as shown in FIG. 17: a channel region is vertically formed; a gate electrode 64 is formed through a gate oxide film 63 in a trench (or, groove) 62 which is formed in a $p^+$-type substrate 61; and, formed in the bottom of the trench 62 is an $n^+$-type region 65, whereby an inverted region extending in a vertical direction is formed in a region immediately under the gate oxide film 63 when a gate voltage is controlled, and the thus inverted region functions as a channel region. Incidentally, the gate electrode 64 is covered by an interlayer insulation film 66.

In such prior art disclosed in the above Japanese Patent Laid-Open No. Hei 3-55879, however, a drain current does not flow in a vertical direction through the $p^+$-type substrate 61. Therefore, the subject matter of this prior art is not a vertical type MOSFET. In other words, this prior art merely shows a MOSFET having a construction in which a channel region is formed in a vertical direction.

Figure 18:
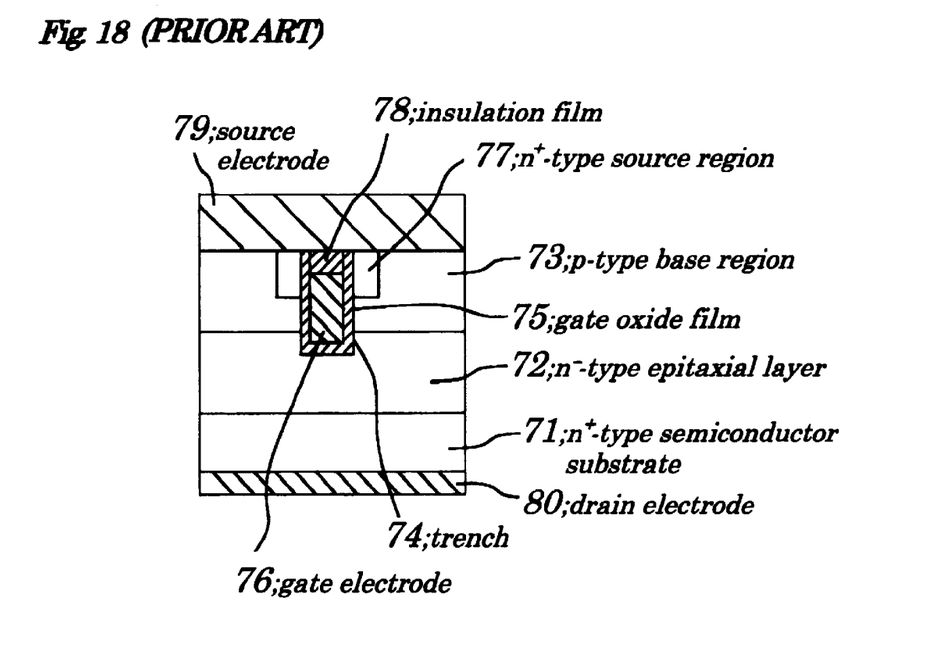
FIG. 18 is a cross-sectional view of a conventional vertical type MISFET.

As for a vertical type MOSFET which is capable of downsizing its cells, the applicant of the subject Patent application has already disclosed such vertical type MOSFET in his previous application (i.e., Japanese Patent application No. Hei 9-254671). As shown in FIG. 18, in this vertical type MOSFET: a p-type base region 73 is formed in an $n^-$-type epitaxial layer 72 which is formed on an $n^+$-type substrate 71; a trench 74 is so formed as to extend across both this $n^-$type epitaxial layer 72 and the p-type base region 73; a gate electrode 76 is formed through a gate insulation film 75 in the trench 74; an $n^+$-type source region 77 is formed in the p-type base region 73 so as to surround the trench 74; the gate electrode 76 is covered with an insulation (i.e., dielectric) film 78; the $n^+$-type source region 77 is connected with the source electrode 79; and, the $n^+$-type substrate 71 is connected with a drain electrode 80, whereby the vertical type MOSFET is produced.

In the vertical type MOSFET having the above construction, it is possible to improve its on-resistance characteristics, and also possible to downsize its cells since its channel region is formed in a vertical direction along a side surface of the trench 74.

However, in the prior art disclosed in the above Japanese Patent application No. Hei 9-254671, since the base region is smaller in depth than the trench, it is difficult to improve the vertical type MOSFET in its pressure-resistance characteristics.

In other words, though the vertical type MOSFET has been widely applied to inductive loads such as switching regulators and the like, when such vertical type MOSFET is applied to the inductive loads, it is necessary to improve the MOSFET in in its pressure-resistance characteristics, which requires that the base region is larger in depth than the trench.

Figure 19:
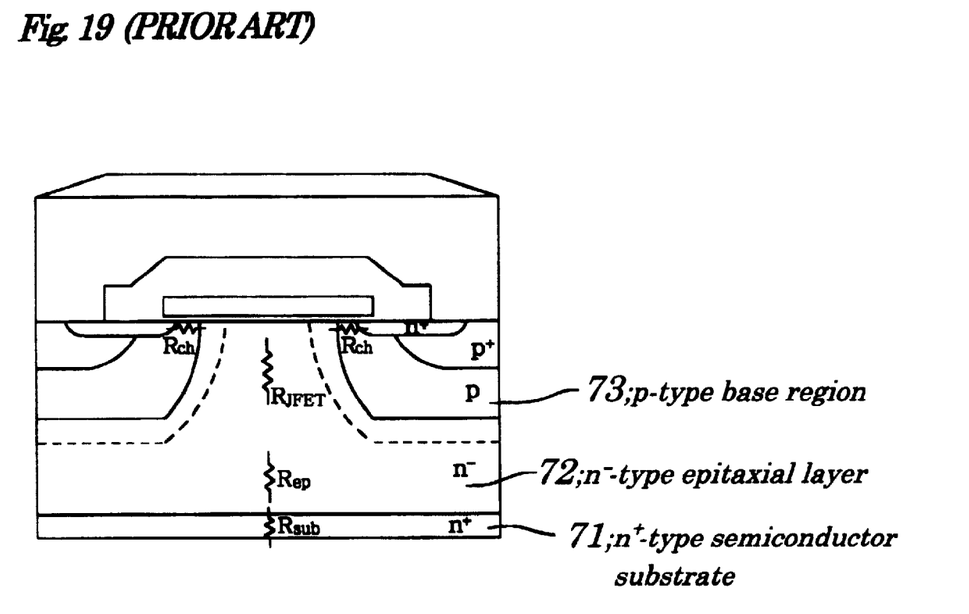
FIG. 19 is a cross-sectional view of a conventional vertical type MISFET, illustrating the disadvantage of forming a base region deeper than a trench.

However, when the base region is formed so as to be merely larger in depth than the trench, an RJFET component (i.e., a resistance component of a junction field-effect transistor), which is an inevitably produced undesired resistance, disadvantageously increases. FIG. 19 is a view illustrating the above, in which more specifically: when the p-type base region 73 is formed deeply in the n⁻-type epitaxial layer 72 formed on the n⁺-type substrate 71, the RJFET component produced in the n⁻-type epitaxial layer 72 increases to function to increase the on resistance of this vertical type MOSFET. Incidentally, in FIG. 19: an RSUB denotes a resistance component of the n⁺-type substrate 71; an Rep denotes a resistance component of the n⁻type epitaxial layer 72; and, Rch denotes a resistance component of the channel region.

Here, it is possible to reduce the on resistance by varying the depth and the width of the trench. However, this not only increases the Rch but also changes in shape the interlayer insulation film being formed in the trench. Consequently, there is a fear that a short fault and like failures will occur due to variations in stress imposed on the source electrode when the wire bonding to the source electrode formed on the interlayer insulation film is conducts.

SUMMARY OF THE INVENTION

Under such circumstances, the present invention was made. Consequently, it is an object of the present invention to provide a vertical type MISFET (Metal Insulator Semiconductor Field Effect Transistor) and a method of its production, and more particularly to a vertical type MISFET and a method of its production, wherein the MISFET has a trench structure which enables the MISFET to be improved in pressure-resistance characteristics without increasing its on resistance.

According to a first aspect of the present invention, the above object of the present invention is accomplished by providing:

In a vertical type MISFET having a construction in which a second conductive type base region is formed in a first conductive type semiconductor substrate forming a drain region, a gate electrode is formed through a gate insulation film in a trench formed in the base region, and a first conductive type source region is formed in the base region around the trench, the improvement wherein:

the base region is so formed as to be deeper than the trench; and immediately under the trench is formed a first conductive type semiconductor region which is higher in impurity concentration than the first conductive type semiconductor substrate.

According to a second aspect of the present invention, the above object of the present invention is accomplished by providing:

The vertical type MISFET as set forth in the first aspect of the present invention, wherein:

formed in the first conductive type semiconductor substrate is a first conductive type semiconductor layer which is lower in impurity concentration than the first conductive type semiconductor substrate; and a second conductive type base region is formed in the first conductive type semiconductor layer.

According to a third aspect of the present invention, the above object of the present invention is accomplished by providing:

The vertical type MISFET as set forth in the first aspect of the present invention, wherein:

a second conductive semiconductor region higher in impurity concentration than the base region is formed in a surface of the base region.

According to a fourth aspect of the present invention, the above object of the present invention is accomplished by providing:

The vertical type MISFET as set forth in the second aspect of the present invention, wherein:

a second conductive semiconductor region higher in impurity concentration than the base region is formed in a surface of the base region.

According to a fifth aspect of the present invention, the above object of the present invention is accomplished by providing:

The vertical type MISFET as set forth in the second aspect of the present invention, wherein:

the first conductive type semiconductor layer is constructed of an epitaxial layer.

According to a sixth aspect of the present invention, the above object of the present invention is accomplished by providing:

The vertical type MISFET as set forth in the third aspect of the present invention, wherein:

the first conductive type semiconductor layer is constructed of an epitaxial layer.

According to a seventh aspect of the present invention, the above object of the present invention is accomplished by providing:

The vertical type MISFET as set forth in the first aspect of the present invention, wherein:

the depth of the trench is less than or equal to approximately 3 $\mu$m.

According to an eighth aspect of the present invention, the above object of the present invention is accomplished by providing:

The vertical type MISFET as set forth in the second aspect of the present invention, wherein:

the depth of the trench is less than or equal to approximately 3 $\mu$m.

According to a ninth aspect of the present invention, the above object of the present invention is accomplished by providing:

The vertical type MISFET as set forth in the third aspect of the present invention, wherein:

the depth of the trench is less than or equal to approximately 3 $\mu$m.

According to a tenth aspect of the present invention, the above object of the present invention is accomplished by providing:

The vertical type MISFET as set forth in the fourth aspect of the present invention, wherein:

the depth of the trench is less than or equal to approximately 3 $\mu$m.

According to an eleventh aspect of the present invention, the above object of the present invention is accomplished by providing:

A method of producing a vertical type MISFET having a construction in which a second conductive type base region is formed in a first conductive type semiconductor substrate forming a drain region, a gate electrode is formed through a gate insulation film in a trench formed in the base region, and a first conductive type source region is formed in the base region around the trench, wherein the base region is so formed as to be deeper than the trench, and, immediately under the trench is formed a first conductive type semiconductor region which is higher in impurity concentration than the first conductive type semiconductor substrate, the method comprising the steps of:

forming the trench in the first conductive type semiconductor which is higher in impurity concentration than the first conductive type semiconductor substrate and formed in the first conductive type semiconductor substrate being formed into a drain region;

forming the second conductive type base region in the first conductive type semiconductor region, the second conductive type base region being larger in depth than the trench;

forming the gate electrode by filling up the trench with a conductive element after the gate insulation film is formed in the trench; and forming the first conductive type source region in the base region around the trench.

According to a twelfth aspect of the present invention, the above object of the present invention is accomplished by providing:

A method of producing a vertical type MISFET having a construction in which a second conductive type base region is formed in a first conductive type semiconductor substrate forming a drain region, a gate electrode is formed through a gate insulation film in a trench formed in the base region, and a first conductive type source region is formed in the base region around the trench, wherein the base region is so formed as to be deeper than the trench, and, immediately under the trench is formed a first conductive type semiconductor region which is higher in impurity concentration than the first conductive type semiconductor substrate, wherein formed in the first conductive type semiconductor substrate is a first conductive type semiconductor layer which is lower in impurity concentration than the first conductive type semiconductor substrate, and a second conductive type base region is formed in the first conductive type semiconductor layer, the method comprising the steps of:

forming the trench in the first conductive type semiconductor which is lower in impurity concentration than the first conductive type semiconductor substrate and formed in the first conductive type semiconductor substrate being formed into a drain region;

forming the second conductive type base region in the first conductive type semiconductor region, the second conductive type base region being larger in depth than the trench;

forming the gate electrode by filling up the trench with a conductive element after the gate insulation film is formed in the trench; forming the first conductive type source region in the base region around the trench; and forming the first conductive type semiconductor region immediately under the trench so as to be adjacent to the first conductive type semiconductor layer, the first conductive type semiconductor region being higher in impurity concentration than the first conductive type semiconductor substrate.

According to a thirteenth aspect of the present invention, the above object of the present invention is accomplished by providing:

The method of producing the vertical type MISFET, as set forth in the eleventh aspect of the present invention, wherein:

the first conductive type semiconductor region is formed by an impurity-ion implantation process or an impurity-ion diffusion process.

According to a fourteenth aspect of the present invention, the above object of the present invention is accomplished by providing:

The method of producing the vertical type MISFET, as set forth in the twelfth aspect of the present invention, wherein:

the first conductive type semiconductor region is formed by an impurity-ion implantation process or an impurity-ion diffusion process.

According to a fifteenth aspect of the present invention, the above object of the present invention is accomplished by providing:

The method of producing the vertical type MISFET, as set forth in the twelfth aspect of the present invention, wherein:

the first conductive type semiconductor layer formed in the step of forming the same is formed by an epitaxial process.

According to a sixteenth aspect of the present invention, the above object of the present invention is accomplished by providing:

The method of producing the vertical type MISFET, as set forth in the eleventh aspect of the present invention, wherein:

a polysilicon film is used as the conductive element in the step of forming the gate electrode.

According to a seventeenth aspect of the present invention, the above object of the present invention is accomplished by providing:

The method of producing the vertical type MISFET, as set forth in the twelfth aspect of the present invention, wherein:

a polysilicon film is used as the conductive element in the step of forming the gate electrode.

According to an eighteenth aspect of the present invention, the above object of the present invention is accomplished by providing:

The method of producing the vertical type MISFET, as set forth in the thirteenth aspect of the present invention, wherein:

a polysilicon film is used as the conductive element in the step of forming the gate electrode.

According to a nineteenth aspect of the present invention, the above object of the present invention is accomplished by providing:

The method of producing the vertical type MISFET, as set forth in the fourteenth aspect of the present invention, wherein:

a polysilicon film is used as the conductive element in the step of forming the gate electrode.

According to a twentieth aspect of the present invention, the above object of the present invention is accomplished by providing:

The method of producing the vertical type MISFET, as set forth in the fifteenth aspect of the present invention, wherein:

a polysilicon film is used as the conductive element in the step of forming the gate electrode.

BRIEF DESCRIPTION OF THE DRAWINGS

The above and other objects, advantages and features of the present invention will be more apparent from the following description taken in conjunction with the accompanying drawings in which.

DETAILED DESCRIPTION OF THE PREFERRED EMBODIMENTS

Now, referring to the drawings, various preferred embodiments of the present invention will be described in detail.

Figure 1:
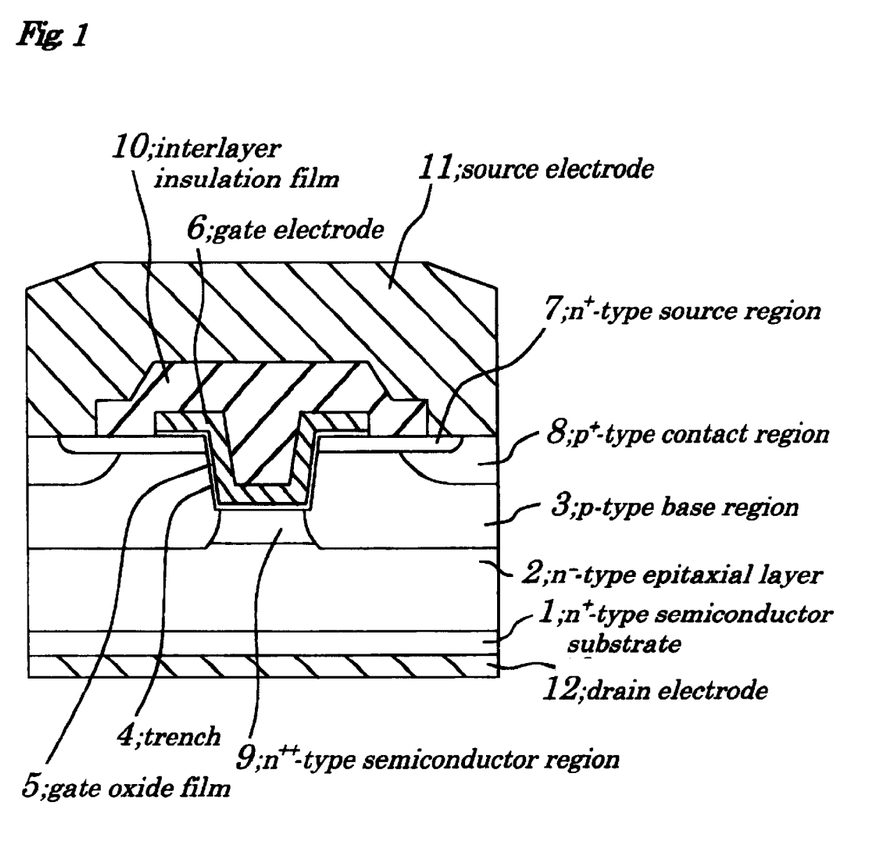
FIG. 1 is a cross-sectional view of the vertical type MISFET of a first embodiment of the present invention.

FIG. 1 shows a vertical type MOSFET of a first embodiment of the present invention. FIGS. 2 to 10 show individual steps of a method of producing the vertical type MOSFET in the order of processing steps.

As shown in the drawings, in this embodiment of the vertical type MOSFET: for example, formed on an n$^+$-type semiconductor substrate (i.e., a high impurity concentration semiconductor substrate) 1 being formed into a drain region is an n$^-$-type epitaxial layer 2 (i.e., a low impurity concentration semiconductor layer), which is lower in impurity concentration than the semiconductor substrate 1, has a resistivity of from 1 to 20 Ωcm, and has a thickness of from 5 to 60 μm. A p-type base region 3 having a depth of from 2 to 4 μm is formed in the n$^-$-type epitaxial layer 2 by ion implanting a p-type impurity into the n$^-$-type epitaxial layer 2. Incidentally, though the n$^+$-type semiconductor substrate 1 actually has a thickness of from 250 to 300 μm, in order to simplify the description of the present invention, the n$^+$-type semiconductor substrate 1 is shown in the drawings so as to be smaller in thickness than the n$^-$-type epitaxial layer 2.

As shown in FIG. 1, a trench 4 has a depth of from 1 to 3 μm smaller than the depth of the p-type base region 3, has a width of from 0.5 to 4.0 μm, and is formed in a substantially central area of the p-type base region 3. In other words, in this embodiment, the p-type base region 3 is so formed as to be deeper than the trench 4.

Further, in the trench 4, formed on a gate oxide film 5 having a film thickness of from 500 to 1500 angstroms is a gate electrode 6 which is constructed of a polysilicon film and has a film thickness of approximately 6000 angstroms. An n$^+$-type source region 7 is formed in a surface of the p-type base region 3 by ion implanting an n-type impurity into such surface. On the other hand, formed adjacent to both the n$^+$-type source region 7 and the surface of the p-type base region 3 is a p$^+$-type contact region 8. Both a gate oxide film 5 and a gate electrode 6 are formed to extend outward so as to cover a portion of a surface of the n$^+$-type source region 7.

Preferably, the depth of the trench 4 is less than or equal to approximately 3 μm. When the depth exceeds this preferable value, an interlayer insulation film 10 formed inside the trench 4 becomes unstable in shape, which impairs a source electrode formed thereof in flatness, and, therefore impairs the wire bonding in its performance.

An n$^{++}$-type semiconductor region (high impurity concentration semiconductor region) 9, which is higher in impurity concentration than the n$^+$-type semiconductor substrate 1 and is adjacent to the n-type epitaxial layer 2, is formed immediately under the trench 4. This n$^{++}$-type semiconductor region 9 functions to reduce the on resistance.

Formed inside trench 4 so as to partially cover both the gate electrode 6 and the n$^+$-type source region 7 is the interlayer insulation film 10 having a film thickness of from 5000 to 10000 angstroms. A source electrode 11 made of aluminum and the like is formed so as to cover an exposed portion of each of the interlayer insulation film 10, n$^+$-type source region 7 and the p$^+$-type contact region 8.

On the other hand, formed in the n$^+$-type semiconductor substrate 1 is a drain electrode 12 which is made of gold, silver, nickel and the like.

In the vertical type MOSFET having the above construction, when a positive voltage equal to or more than a predetermined threshold value is applied as a control voltage to a region between the gate electrode 6 and the source electrode 7, a side surface of the p-type base region 3 adjacent to the gate oxide film 5 under the gate electrode 6 is inverted into an n-type to form a channel region. As result, a drain current flows through the n$^+$-type semiconductor substrate 1, n$^-$-type epitaxial layer 2, n$^{++}$-type semiconductor region 9 and the channel region to the n$^+$-type source region 7, whereby the vertical type MOSFET operates.

Next, with reference to FIGS. 2 to 10, the method of producing this vertical type MOSFET will be described in the order of its production steps.

Figure 2:
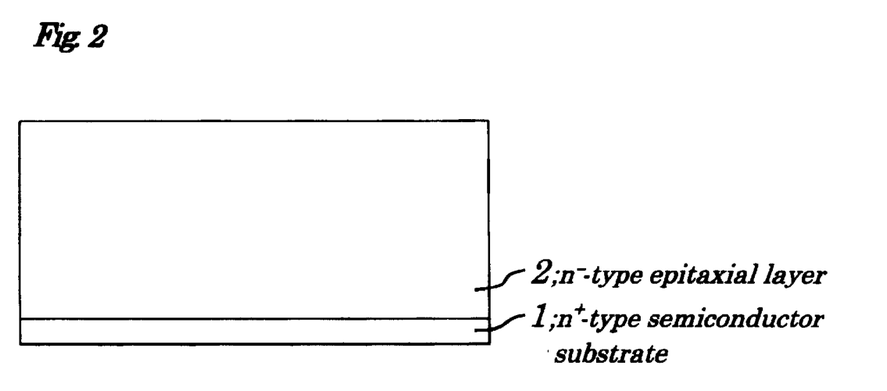
FIG. 2 shows one of steps of a method of producing the vertical type MISFET.

As shown in FIG. 2, for example, previously formed through the epitaxial process on the n$^+$-type semiconductor substrate 1 formed into a drain region is the n$^-$-type epitaxial layer 2, wherein the n$^-$-type epitaxial layer 2 contains the n-type impurity as is in the semiconductor substrate 1 but lower in impurity concentration than the semiconductor substrate 1, and, therefore has a resistivity of from 1 to 20 Ωcm and has a thickness of from 5 to 60 μm.

Figure 3:
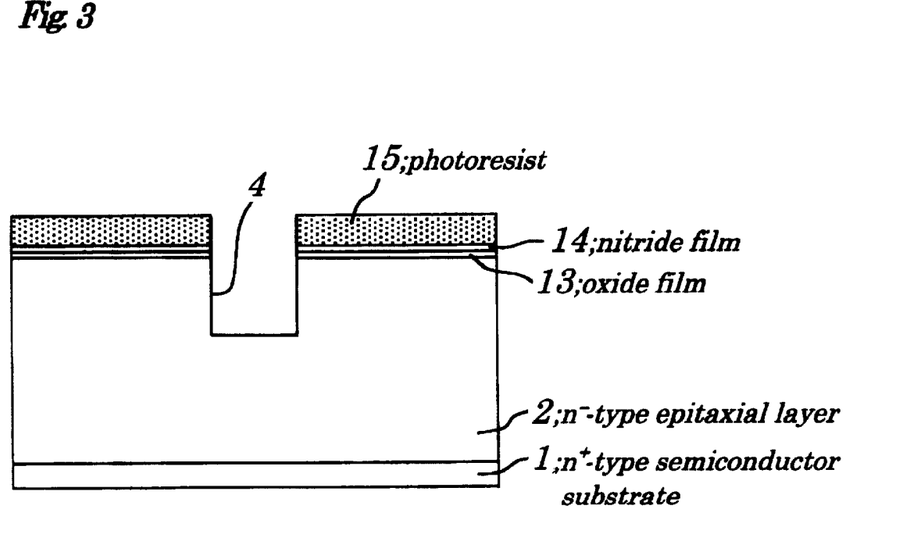
FIG. 3 shows one of steps of a method of producing the vertical type MISFET.

Then, as shown in FIG. 3, sequentially formed on this n$^-$-type epitaxial layer 2 through the CVD process are an oxide film (SiO$_2$) 13 having a film thickness of approximately 1000 angstroms and a nitride film (Si$_3$N$_4$) 14 having a film thickness of approximately 1000 angstroms. After that, the thus formed nitride film 14 is covered with a photoresist film 15 which is then subjected to a photolithography process to remain only in necessary portions.

Subsequent to the above, the trench 4 is formed by partially removing each of the nitride film 14, oxide film 13 and the n$^-$type epitaxial layer 2 through a dry etching process in which the photoresist film 15 is used as a resist mask. The trench 4 thus formed has, for example, a depth of from 1 to 3 μm and a width of from 0.5 to 4.0 μm.

Figure 4:
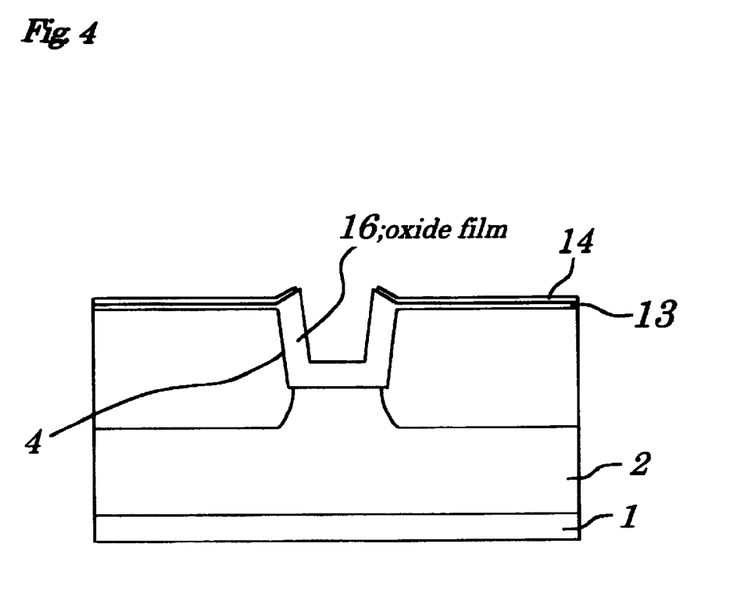
FIG. 4 shows one of steps of a method of producing the vertical type MISFET.

Then, as shown in FIG. 4, all the photoresist film 15 is removed. After that, a partial oxidation process is conducted through a well-known LOCOS (i.e., Local Oxidation of Silicon) process, so that a relatively thick oxide film 16 is formed inside the trench 4, the thickness of the oxide film 16 being approximately 1 μm. In the oxidation process, since any portion other than the trench 4 is covered with the mask of the nitride film 14. the oxide film 16 does not grow. Incidentally, the oxide film 13 prevents the nitride film 14 from being brought into direct contact with the n$^-$-type epitaxial layer 2, which makes it possible to prevent any crystal defects from being developed in this surface of the n$^-$type epitaxial layer 2.

Figure 5:
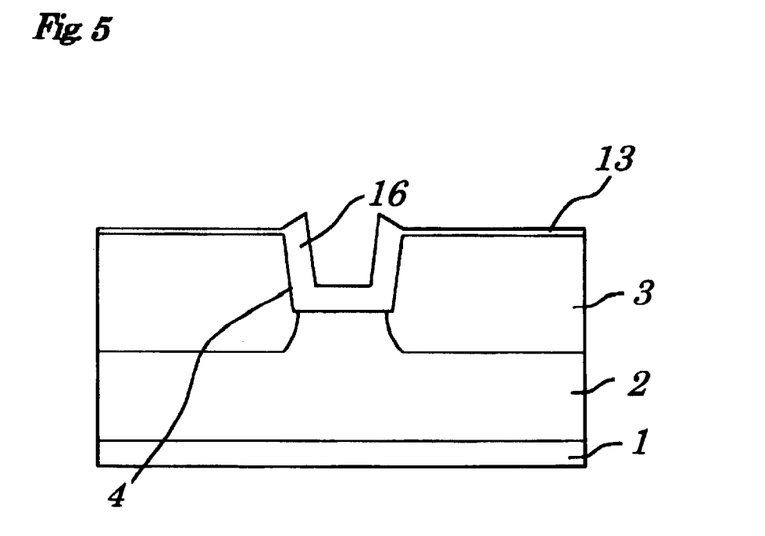
FIG. 5 shows one of steps of a method of producing the vertical type MISFET.

Subsequent to the above, as shown in FIG. 5, after the nitride film 14 is removed, the oxide film 16 is used as a mask in ion-implanting an n-type impurity such as phosphorus (P), arsenic (As) and like impurities with a dose of from $10^{13}$ to $10^{14}$/cm$^2$ into the n$^-$type epitaxial layer 2, so that the p-type base region 3 is formed. In this case, it is necessary to form such p-type base region 3 deeper than the trench 4.

Figure 6:
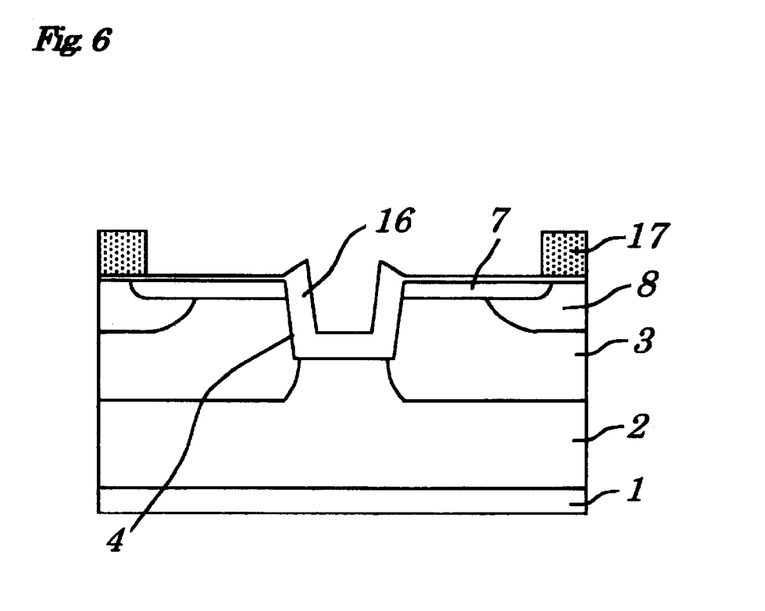
FIG. 6 shows one of steps of a method of producing the vertical type MISFET.

Then, as shown in FIG. 6, a p-type impurity such as boron (B) and the like with a dose of from $10^{14}$ to $10^{16}$/cm$^2$ is ion-implanted into the surface of the p-type base region 3 using a photoresist (not shown) as a mask, so that the P$^+$-type contact region 8 is formed.

In the same manner as that described in the above, the n-type impurity such as P, As and the like with a dose of from $10^{15}$ to $10^{16}$/cm$^2$ is implanted to form the n$^+$-type source region 7. The n$^+$-type source region 7 and the P$^+$-type contact region 8 are so formed as to be adjacent to each other.

Figure 7:
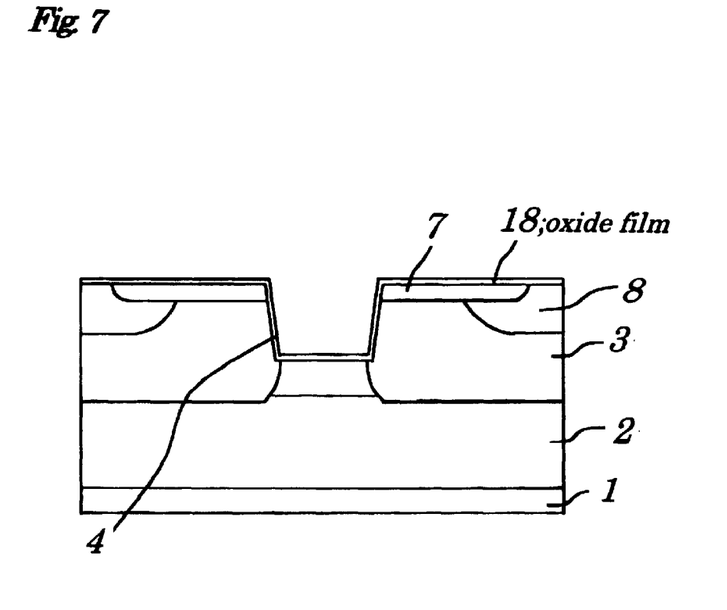
FIG. 7 shows one of steps of a method of producing the vertical type MISFET.

Subsequent to the above, as shown in FIG. 7, all the oxide films 13, 16 and the photoresist film 17 are removed. After that, an oxidation treatment is performed again so that the oxide film 18 having a film thickness of approximately 200 angstroms is developed.

Figure 8:
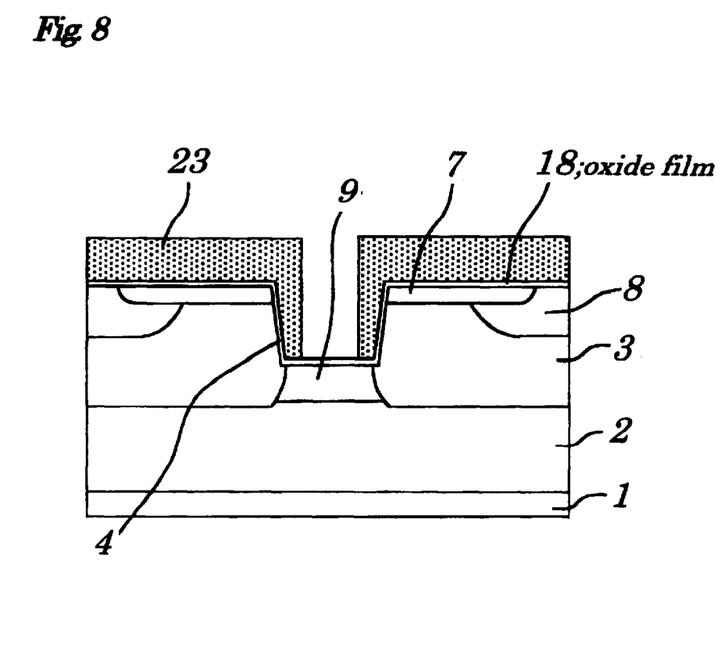
FIG. 8 shows one of steps of a method of producing the vertical type MISFET.

Then, as shown in FIG. 8, the n$^{++}$-type semiconductor region 9 is formed immediately under the trench 4 by ion-implanting the n-type impurity such as P, As and the like with a dose of from $10^{11}$ to $10^{13}$/cm$^2$ into the region immediately under the trench 4 with the use of the photoresist functioning as a mask, wherein the n$^{++}$-type semiconductor region 9 is higher in impurity concentration than the n$^+$-type semiconductor substrate 1, and is adjacent to the n$^-$-type epitaxial layer 2. The above method of formation may be accomplished using not only the ion implantation process but also an ordinary diffusion process and like processes.

Figure 9:
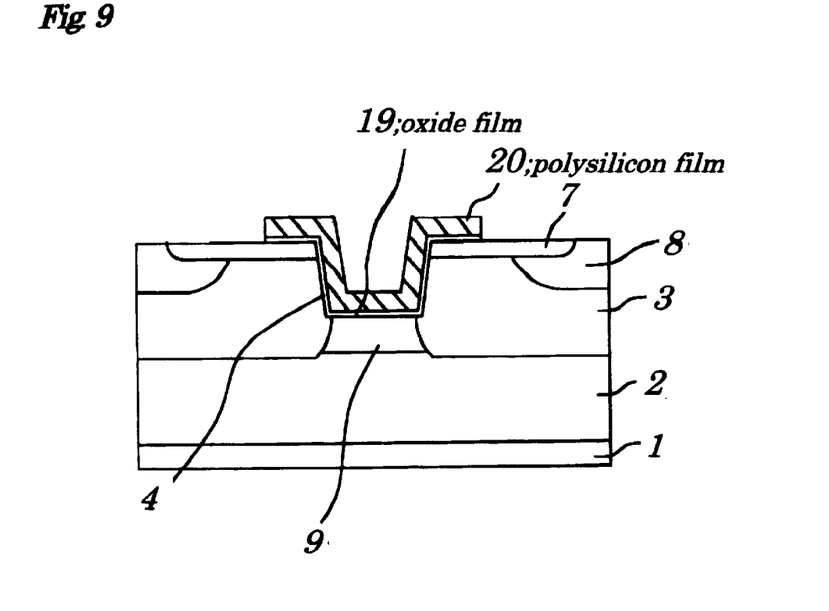
FIG. 9 shows one of steps of a method of producing the vertical type MISFET.

Next, as shown in FIG. 9, after completion of removal of the oxide film 18, a thermal oxidation process is applied to form an oxide film 19 having a thickness of from 500 to 1500 angstroms over the entire surface. Subsequent to the above, a polysilicon film 20 having a thickness of approximately 6000 angstroms is formed through the CVD process so as to fill up the interior of the trench 4. After that, a photolithography process is applied to permit only the films 19, 20 located in necessary areas to remain, so that the gate oxide film 5 and the gate electrode 6 are formed.

Figure 10:
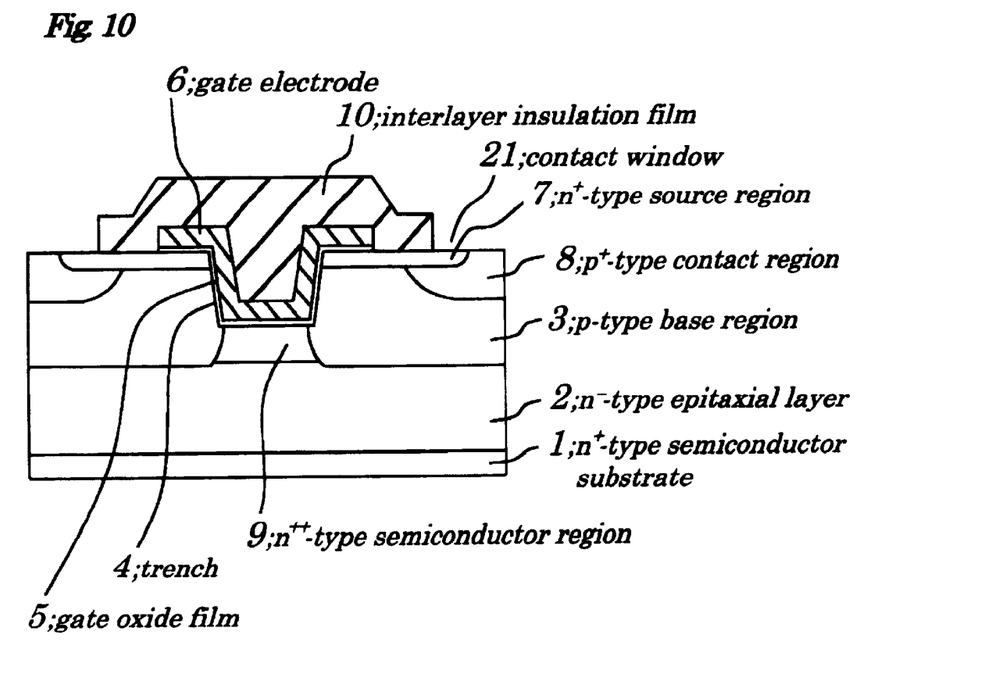
FIG. 10 shows one of steps of a method of producing the vertical type MISFET.

Then, as shown in FIG. 10, using the CVD process, the interlayer insulation film 10 having a thickness of from 5000 to 10000 angstroms are formed so as to fill up the trench 4 and to cover the entire surfaces of both the gate electrode 6 and the n$^+$-type source region 7. Subsequent to this, using the photolithography process, a contact window 21 is formed in the interlayer insulation film 10 so as to partially expose both the n$^+$-type source region 7 and the P$^+$-type contact region 8.

After that, the source electrode 11 made of aluminum and the like is formed so as to cover the thus exposed portions of the n$^+$-type source region 7 and those of the P$^+$-type contact region 8. Formed on the n$^+$-type semiconductor substrate 1 is the drain electrode 12 made of gold, silver, nickel and the like. As a result, this embodiment of the vertical type MOSFET is completed.

As described above, in this embodiment of the present invention having the above construction: the p-type base region 3 is so formed as to be deeper than the trench 4; and, immediately under this trench 4, the n$^{++}$-type semiconductor region 9 is formed, which is adjacent to the n$^-$-type epitaxial layer 2 and is higher in impurity concentration than the n$^+$-type semiconductor substrate 1. Consequently, it is possible for the vertical type MOSFET of this embodiment to improve its pressure-resistance characteristics without increasing the on resistance thereof.

In other words, in this embodiment of the present invention, since the p-type base region 3 is deeper than the trench 4 and the n$^{++}$-type semiconductor region 9 higher in impurity concentration than the n$^+$-type semiconductor substrate 1 is located immediately under the trench 4, there is no fear that the undesired RJFET component inevitably formed increases, which makes it possible to prevent the on resistance from increasing. Furthermore, in this embodiment of the present invention, since the p-type base region 3 is so formed as to be deeper than the trench 4, it is possible to improve the MOSFET of the present invention in its pressure-resistance characteristics in an easy manner.

Consequently, in a condition in which the vertical type MOSFET of the present invention keeps its excellent switching properties effective, the MOSFET is easily applied to inductive loads such as switching regulators and the like.

Now, a second embodiment of the present invention will be described.

Figure 11:
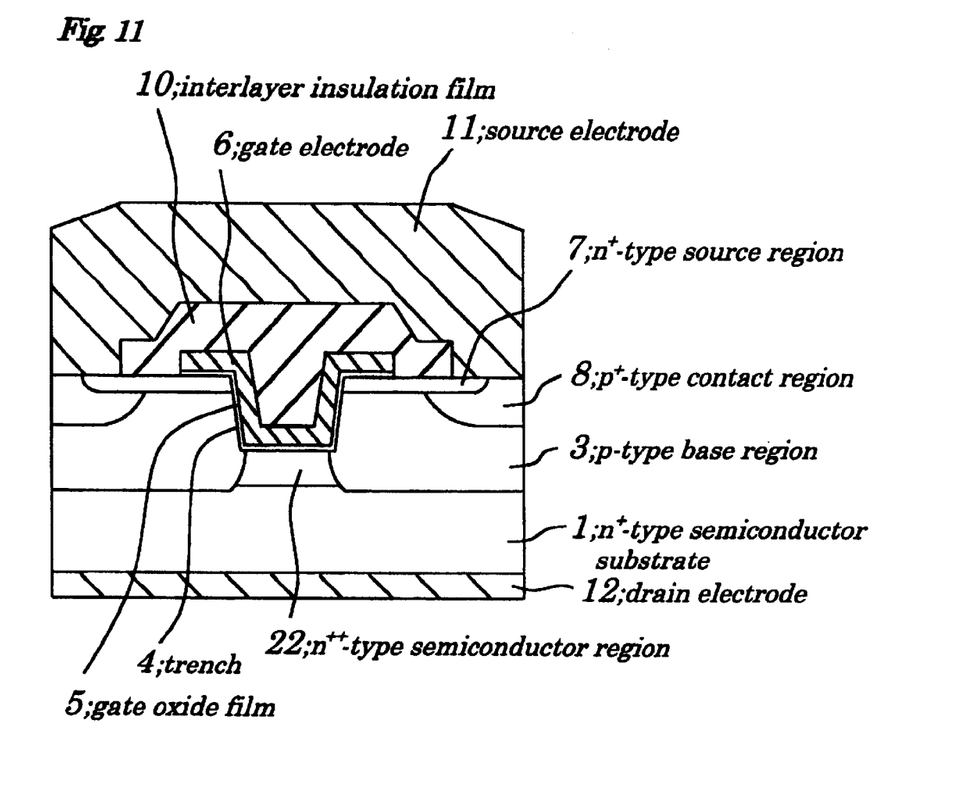
FIG. 11 shows one of steps of a method of producing the vertical type MISFET.

FIG. 11 is a schematic cross-sectional view of the vertical type MOSFET of this second embodiment. The big difference in construction between the vertical type MOSFET of this second embodiment and that of the above first embodiment (shown in FIG. 1) is that the second embodiment has no region corresponding to the n-type semiconductor layer (i.e., low impurity-concentration layer) 2 on the n$^+$-type semiconductor substrate (i.e., high impurity-concentration substrate) 2 in the first embodiment of the present invention.

Further, an n$^{++}$-type semiconductor region 22 which is higher in impurity concentration than the n$^+$-type semiconductor substrate 1 and located immediately under the trench 4 is formed by previously ion-implanting the n-type impurity into the n$^+$-type semiconductor substrate 1. The p-type base region 3 is so formed as to be deeper than the n$^{++}$-type semiconductor region 22 by ion-implanting the p-type impurity. On the other hand, the trench 4 is so formed as to be smaller in depth than the p-type base region 3.

Now, with reference to FIGS. 12 to 15, a method of producing the vertical type MOSFET of the present invention will be described in the order of process steps.

Figure 12:
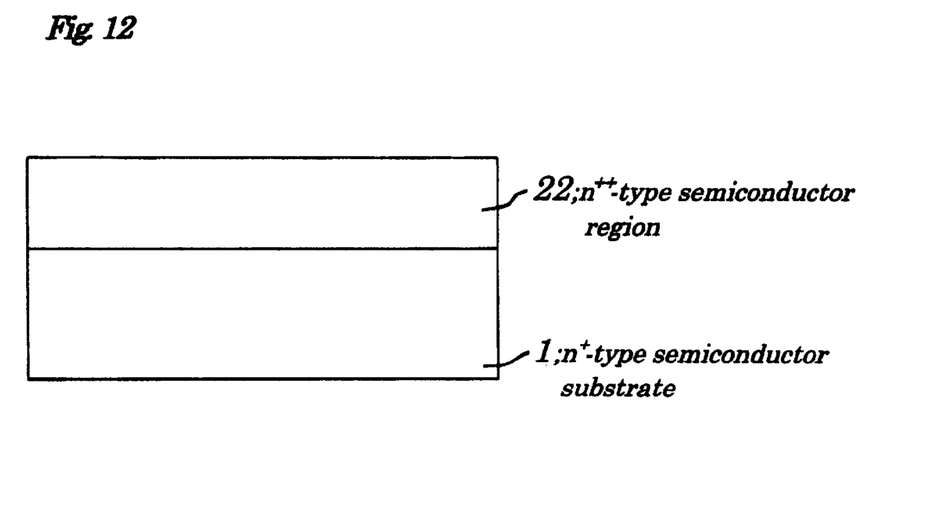
FIG. 12 shows one of steps of a method of producing the vertical type MISFET.

First, as shown in FIG. 12, by previously ion-implanting the n-type impurity into, for example, the n$^+$-type semiconductor substrate 1 which forms a drain region, there is formed the n$^{++}$-type semiconductor region 22 which is higher in impurity concentration than the n⁺-type semiconductor substrate 1 and has a depth of from 2 to 5 μm. This n⁺⁺-type semiconductor region 22 provides the same function as that of the n⁺⁺-type semiconductor region 2 of the first embodiment, and may be formed using any suitable process such as the ion implantation process, ordinary diffusion process of the impurity, and like processes.

Figure 13:
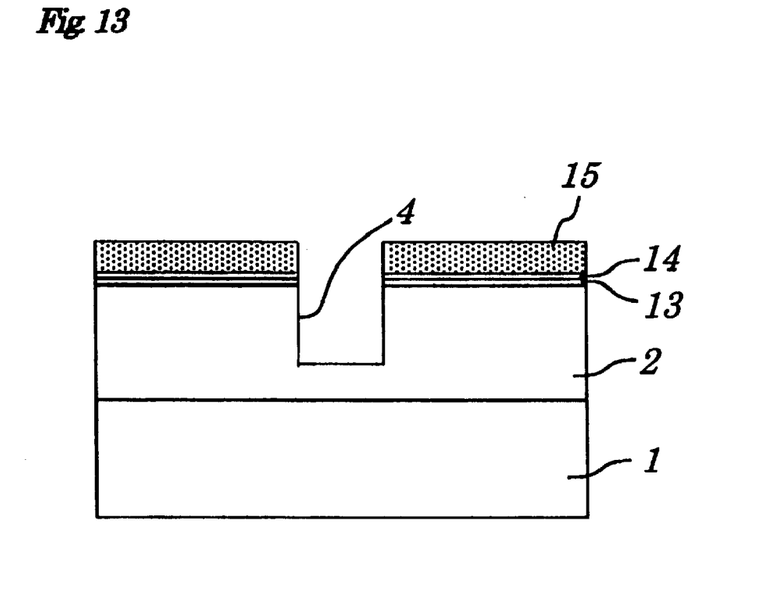
FIG. 13 shows one of steps of a method of producing the vertical type MISFET.

Then, as shown in FIG. 13, using the CVD process, subsequently formed on the n⁺⁺-type semiconductor region 22 are: the oxide film 13 having a thickness of approximately 1000 angstroms; and, the nitride film 14 having a thickness of approximately 1000 angstroms. After that, the photoresist film 15 is formed to cover the nitride film 14. Subsequent to the above, using the photolithography process, all the photoresist film 15 other than those located in the necessary portions is removed. After that, the photoresist film 15 not removed is used as a resistive mask in the dry etching process, so that the nitride film 14, oxide film 13 and the n⁺⁺-type semiconductor region 22 are partially removed to form the trench, which has a depth of from 1 to 3 μm and a width of from 0.5 to 4.0 μm.

Figure 14:
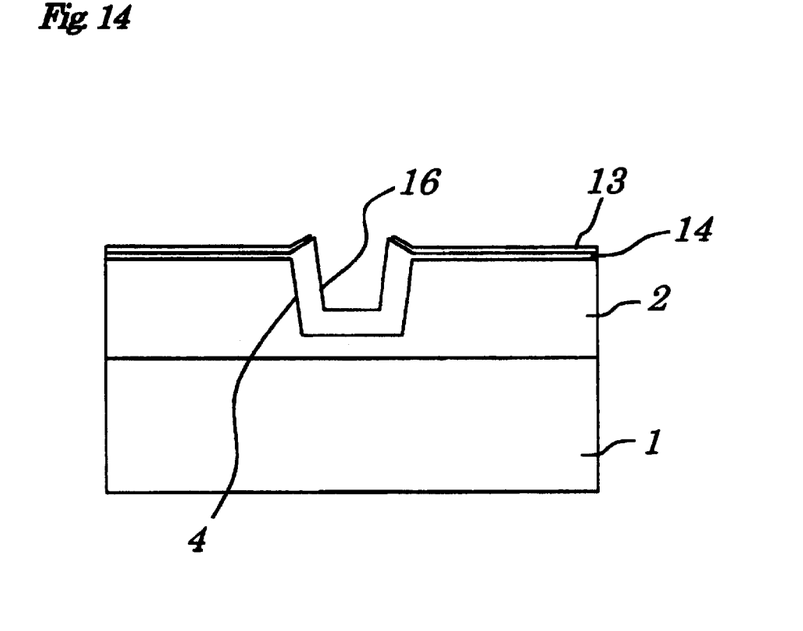
FIG. 14 shows one of steps of a method of producing the vertical type MISFET.

Subsequent to the above, as shown in FIG. 14, after the photoresist 15 is removed, a partial oxidation process is carried out using the conventional LOCOS process so that the oxide film 16 having a relatively large thickness of from approximately 16 μm is developed inside the trench 4. In this oxidation process, since the remaining portion of the oxide film 16 other than that located inside the trench 4 is covered or masked with the nitride film 14, there is no fear that such remaining portion of the oxide film 16 is developed.

Figure 15:
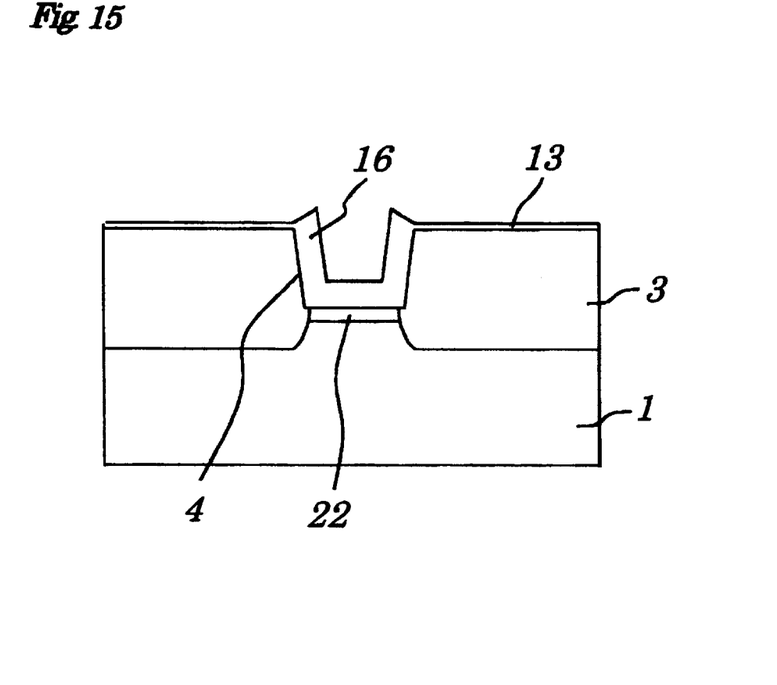
FIG. 15 shows one of steps of a method of producing the vertical type MISFET.

After that, as shown in FIG. 15, after the nitride film 14 is removed, the oxide film 16 is used as a mask in ion-implanting the n-type impurity such as phosphorus (P), arsenic (As) and the like with a dose of from $10^{13}$ to $10^{14}/cm^2$ into the n-type semiconductor region 22, so that the p-type base region 3 having a depth of from 2 to 6 μm and deeper than the n⁺⁺-type semiconductor region 22 is formed. In this case, it is necessary to form such p-type base region 3 deeper than the trench 4. As a result, only the n⁺⁺-type semiconductor region 22 located immediately under the trench 4 remains.

After that, through the same process steps as those described in the above with reference to the first embodiment of the present invention (shown in FIGS. 6 to 10), the second embodiment of the vertical type MOSFET of the present invention is completed. Consequently, in FIG. 10, parts corresponding to those shown in FIG. 1 are denoted by like reference numerals, and descriptions thereof are omitted to avoid redundancy in description.

As described above, even when the n-type epitaxial layer (in the step of FIG. 2) is omitted in the second embodiment of the present invention, it is possible for the vertical type MOSFET of the present invention to obtain substantially the same effect as that of the first embodiment of the present invention. Further, in this second embodiment of the present invention, no n-type epitaxial layer (in the step of FIG. 2) is required, which enables the present invention to take less labor in producing the vertical type MOSFET, and, therefore to realize a considerable cost reduction.

In the above, though the embodiments of the present invention have been described in detail with reference to the drawings, the present invention is not limited in construction to such concrete constructions of the embodiments. Any modifications not departing from the spirit of the present invention are included in the present invention. For example, in the first embodiment of the present invention described above, though the n-type epitaxial (i.e., semiconductor) layer 2 is formed on the n⁺-type semiconductor substrate 1 using the epitaxial process, such n-type semiconductor layer may be formed using any other suitable process in addition to the epitaxial process, for example such as an ion implantation process, through which an n-type semiconductor layer doped with an impurity supplied from the outside can be formed.

Further, in the first and the second embodiment of the present invention, though the vertical type MOSFET has been described in the above, the present invention is not limited thereto but may use MONOS structures and the like in addition to the MOS structures, so long as the MIS (i.e., Metal Insulator Semiconductor) type FET is used. Further, in the present invention, the conductive type of each of the semiconductor layers or semiconductor regions may be an n-type (or, p-type) in place of the p-type (or, n-type).

As described above, in the vertical type MISFET and a method of its production: the base region is so formed as to be deeper than the trench; and, immediately under this trench is formed a high impurity-concentration semiconductor region which is higher in impurity concentration than a high impurity-concentration semiconductor substrate. Due to the above construction, it is possible for the present invention to improve the vertical type MISFET in its pressure resistance without increasing its on-resistance.

Finally, the present application claims the priority of Japanese Patent Application No. Hei10-038287 filed on Feb. 20, 1998, which is herein incorporated by reference.

What is claimed is:

1. In a vertical type MISFET having a construction in which a second conductive type base region is formed in a first conductive type semiconductor substrate forming a drain region, a gate electrode is formed through a gate insulation film in a trench formed in said base region, and a first conductive type source region is formed in said base region around said trench, the improvement wherein:
    said base region is so formed as to be deeper than said trench; and
    immediately under said trench is formed a first conductive type semiconductor region which is higher in impurity concentration than said first conductive type semiconductor substrate.

2. The vertical type MISFET as set forth in claim 1, wherein:
    formed in said first conductive type semiconductor substrate is a first conductive type semiconductor layer which is lower in impurity concentration than said first conductive type semiconductor substrate; and
    a second conductive type base region is formed in said first conductive type semiconductor layer.

3. The vertical type MISFET as set forth in claim 1, wherein a second conductive semiconductor region with a higher impurity concentration than said base region is formed in a surface of said base region.

4. The vertical type MISFET as set forth in claim 2, wherein:
    a second conductive semiconductor region higher in impurity concentration than said base region is formed in a surface of said base region.

5. The vertical type MISFET as set forth in claim 2, wherein:
    said first conductive type semiconductor layer is constructed of an epitaxial layer.

6. The vertical type MISFET as set forth in claim 3, wherein:
    said first conductive type semiconductor layer is constructed of an epitaxial layer.

7. The vertical type MISFET as set forth in claim 1, wherein:
    the depth of said trench is less than or equal to approximately 3 μm.

8. The vertical type MISFET as set forth in claim 2, wherein:

the depth of said trench is less than or equal to approximately 3 µm.

9. The vertical type MISFET as set forth in claim 3, wherein:

the depth of said trench is less than or equal to approximately 3 µm.

10. The vertical type MISFET as set forth in claim 4, wherein:

the depth of said trench is less than or equal to approximately 3 µm.

11. The vertical MISFET of claim 1, wherein said first conductive type semiconductor region has a width no larger than a width of the trench.

12. The vertical MISFET of claim 1, wherein said first conductive type semiconductor region has a thickness in the range of 2–5 µm.

13. The vertical MISFET of claim 1, wherein a sidewall of the trench at a bottommost portion of said sidewall is in direct contact with said base region.

14. A vertical MISFET comprising:

a first conductivity $^+$ type substrate having a drain electrode on a first surface thereof;

a second conductivity type base region directly on a second surface of said substrate opposite said first surface;

a trench in said base region that has a bottom that is separated from said substrate, said trench having a gate electrode therein;

a first conductivity $^{++}$ type low resistivity region directly between the bottom of said trench and said substrate, said low resistivity region contacting the bottom of said trench and said second surface of said substrate and having a dopant concentration higher than a dopant concentration of said substrate; and a first conductivity $^+$ type source region at a surface of said base adjacent to said trench, and a source electrode in contact therewith.

15. The MISFET of claim 14, wherein an entirety of said low resistivity region is directly between the bottom of said trench and said substrate.

16. A vertical MISFET comprising:

a first conductivity $^+$ type substrate having a drain electrode on a first surface thereof;

a first conductivity $^-$ type epitaxial layer on a second surface of said substrate opposite said first surface, said epitaxial layer having a dopant concentration less than that of said substrate;

a second conductivity type base region directly on said epitaxial layer;

a trench in said base region that has a bottom that is separated from said epitaxial layer, said trench having a gate electrode therein;

a first conductivity $^{++}$ type low resistivity region between the bottom of said trench and said epitaxial layer, said low resistivity region directly contacting the bottom of said trench and said epitaxial layer and having a dopant concentration higher than that of said substrate; and a first conductivity $^+$ type source region at a surface of said base adjacent to said trench, and a source electrode in contact therewith.

17. The MISFET of claim 16, wherein an entirety of said low resistivity region is directly between the bottom of said trench and said epitaxial layer.

\* \* \* \* \*